United States Patent
Yeh

(10) Patent No.: US 9,155,215 B1
(45) Date of Patent: Oct. 6, 2015

(54) DISPLAY WITH INTEGRATED BATTERY

(71) Applicant: Yuting Yeh, Sunnyvale, CA (US)

(72) Inventor: Yuting Yeh, Sunnyvale, CA (US)

(73) Assignee: Amazon Technologies, Inc., Reno, NV (US)

( * ) Notice: Subject to any disclaimer, the term of this patent is extended or adjusted under 35 U.S.C. 154(b) by 402 days.

(21) Appl. No.: 13/625,747

(22) Filed: Sep. 24, 2012

(51) Int. Cl.
*H01M 10/04* (2006.01)
*H05K 7/06* (2006.01)

(52) U.S. Cl.
CPC ............ *H05K 7/06* (2013.01); *H01M 10/0436* (2013.01)

(58) Field of Classification Search
None
See application file for complete search history.

(56) References Cited

U.S. PATENT DOCUMENTS

| | | | |
|---|---|---|---|
| 2009/0153773 A1* | 6/2009 | Kuroda | 349/62 |
| 2009/0244456 A1* | 10/2009 | Miyazaki et al. | 349/122 |
| 2010/0075181 A1* | 3/2010 | Niessen et al. | 429/9 |
| 2011/0082704 A1* | 4/2011 | Blum | 705/2 |
| 2012/0236009 A1* | 9/2012 | Aflatooni et al. | 345/501 |
| 2013/0084476 A1* | 4/2013 | Ellis-Monaghan et al. | 429/61 |
| 2014/0268532 A1* | 9/2014 | Nicol et al. | 361/679.26 |

* cited by examiner

*Primary Examiner* — Patrick Ryan
*Assistant Examiner* — Wyatt McConnell
(74) *Attorney, Agent, or Firm* — Lowenstein Sandler LLP

(57) ABSTRACT

An electronic device including a display supported by a substrate is described. A plurality of electrochemical cells are embedded in the substrate to provide power without increasing the size and weight of the electronic device.

15 Claims, 9 Drawing Sheets

DISPLAY WITH INTEGRATED BATTERY

BACKGROUND

A large and growing population of users enjoy entertainment through the consumption of digital media items, such as music, movies, images, electronic books and so on. Users employ various electronic devices to consume such media items. Among these electronic devices are electronic book readers, cellular telephones, personal digital assistants (PDAs), portable media players, tablet computers, netbooks and the like.

These electronic devices often include a battery to power electrical components of the electronic device. The battery may significantly contribute to the size and weight of the device.

BRIEF DESCRIPTION OF THE DRAWINGS

The present invention will be understood more fully from the detailed description given below and from the accompanying drawings of various embodiments of the present invention, which, however, should not be taken to limit the present invention to the specific embodiments, but are for explanation and understanding only. Further, it should be understood that the drawings are not necessarily proportional or to scale.

DETAILED DESCRIPTION

Embodiments of an electronic device including a display having an integrated battery are described. The display includes an imaging component mechanically supported by a substrate. A collection of electrochemical cells are embedded within the substrate and electrically connected to form a battery. Thus, the substrate provides both mechanical support for the imaging component and durability to the display and also provides electric energy for the display and other components of the electronic device. Further, by incorporating a battery into the display, the amount of "dead" or "inactive" space is reduced and the weight and size of the electronic device can be reduced. In particular, the thickness of the electronic device can be reduced such that an embodiment of the electronic device having a battery embedded in the display is thinner than an embodiment of the electronic device having a battery that is not embedded in the display.

Figure 1:
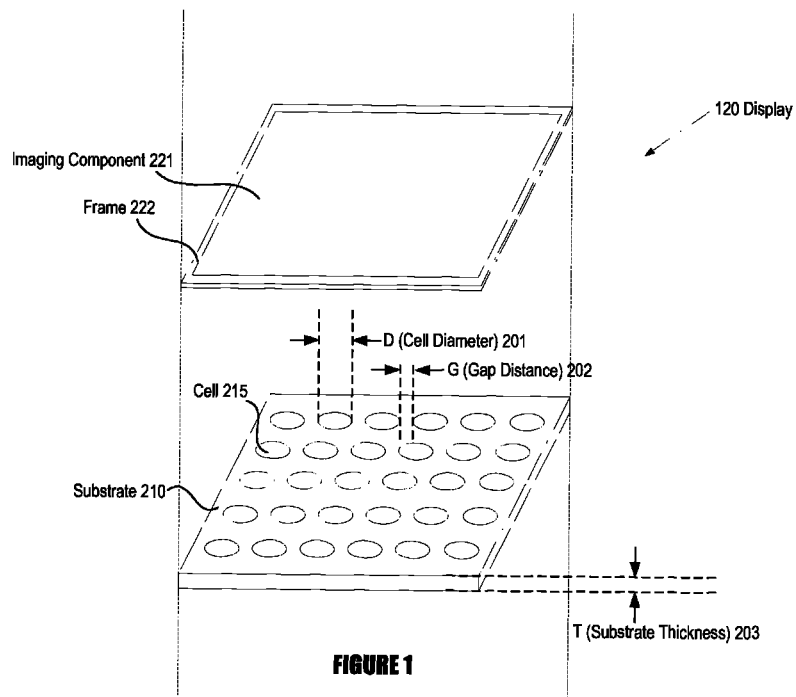
FIG. 1 illustrates an exploded perspective view of an embodiment of a display.

FIG. 1 illustrates an exploded perspective view of an embodiment of a display 120. The display includes an imaging component 221 which can display text, images or other media. The imaging component 221 may comprise a liquid crystal display (LCD), an electronic paper display, or any another type of display. For example, an electronic paper display may comprise a bi-stable LCD display, a microelectromechanical system (MEMS) display, a cholesteric display, an electrophoretic display, or another electronic paper display. One exemplary electronic paper display that may be used is an E Ink-brand display. The imaging component 221 may also comprise a touchpad which can receive input from a user. In one embodiment, the imaging component 221 comprises a touchscreen.

In one embodiment, the imaging component 221 is surrounded by a frame 222 which provides mechanical support to the imaging component 221 and protects the imaging component 221 from damage. Further, the frame 222 may include conductive pathways which address individual pixels of the imaging component 221 and allow the imaging component 221 to be coupled to processor or driver for displaying text, images or other media.

Figure 2:
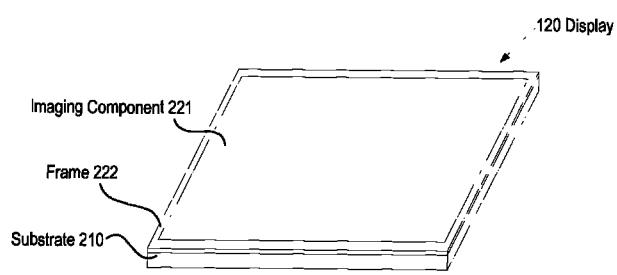
FIG. 2 illustrates a perspective view of an embodiment of a display.

When assembled, as illustrated in FIG. 2, the imaging component is supported by a substrate 210. The substrate 210 provides mechanical support to the imaging component 221 and protects the imaging component 221 from damage. In one embodiment, the substrate 210 is composed of glass. In another embodiment, the substrate 210 may be composed of plastic, silicon, metal, or any other material.

Embedded in the substrate 210 is a plurality of electrochemical cells 215. Each cell 215 generates a voltage and current through chemical reaction. The cells 215 may be connected in series, parallel, or some combination of series and parallel to form a battery. In one embodiment the cells 215 are lithium ion cells. In another embodiment, the cells 215 are alkaline cells, nickel-cadmium cells, nickel metal hydride cells, or any other type of cell. In one embodiment, the electrochemical cells 215 are capacitors.

The cells 215 may be arranged in a regular grid pattern, an offset grid pattern, a random pattern or in any other pattern. The cells 215 may each have a cell diameter (D) 201 may be spaced apart by a gap distance (G) 202. The cell diameter (D) 201 may be approximately 1.0 mm or less. For example, in one embodiment, the cell diameter (D) 201 is approximately 1.5 millimeter (mm). As another example, the cell diameter (D) 201 may be approximately 0.75 mm. The cell diameter (D) 201 may be any size.

The gap distance (G) 202 may be the same order of magnitude as the cell diameter (D) 201. For example, in one embodiment, the gap distance (G) 202 is twice the cell diameter (D) 201. As another example, the gap distance (G) 202 may be approximately equal to the cell diameter (D) 201. As another example, the gap distance (G) 202 may be about half the cell diameter (D) 201. The gap distance (G) 202 may be much greater than the cell diameter (D) 201. For example, in one embodiment, the gap distance (G) 202 is at least five times the cell diameter (D) 201. In another embodiment, the gap distance (G) 202 is at least ten times the cell diameter (D) 201. The gap distance (G) 202 may be any size, irrespective of the cell diameter (D) 201.

The cell diameter (D) 201 and the gap distance (G) 202 define a cell density that is the amount of substrate (by surface area) that comprises the cells 215. The cell density may be low enough so as to not compromise the structural integrity of the substrate 210 to provide mechanical support to the imaging component 221. In one embodiment, the cell density is approximately 50%. In another embodiment, the cell density is approximately 75% or greater. In another embodiment, the cell density is approximately 25% or less. The cell density may be any value.

The substrate 210 has a thickness (T) 203 sufficient to provide mechanical support to the imaging component 221. The substrate thickness (T) 203 may be less than a millimeter. For example, the substrate thickness (T) 203 may be approximately 0.7 mm. As another example, the substrate thickness (T) 203 may be about 0.5 mm. The cell diameter (D) 201 may be the same order of magnitude as the substrate thickness (T) 203. For example, in one embodiment, the substrate thickness (T) 203 may be about 0.5 mm and the cell diameter may be about 1.0 mm. The substrate 210 may be substantially planar. In particular, the substrate 210 may have a thickness that is much less than any other dimension (e.g., height or width) of the substrate 210. Further, the substrate 210 may be substantially flat. In another embodiment, the substrate 210 may be otherwise shaped.

FIG. 2 illustrates a perspective view of an embodiment of a display 120. As shown in FIG. 2, the imaging component 221 rests upon and is supported by the substrate 210. Further, as assembled in FIG. 2, the imaging component 221 occludes a user's view of the substrate 210. Thus, the cells 215 are not visible when the display 120 is assembled.

Figure 3:
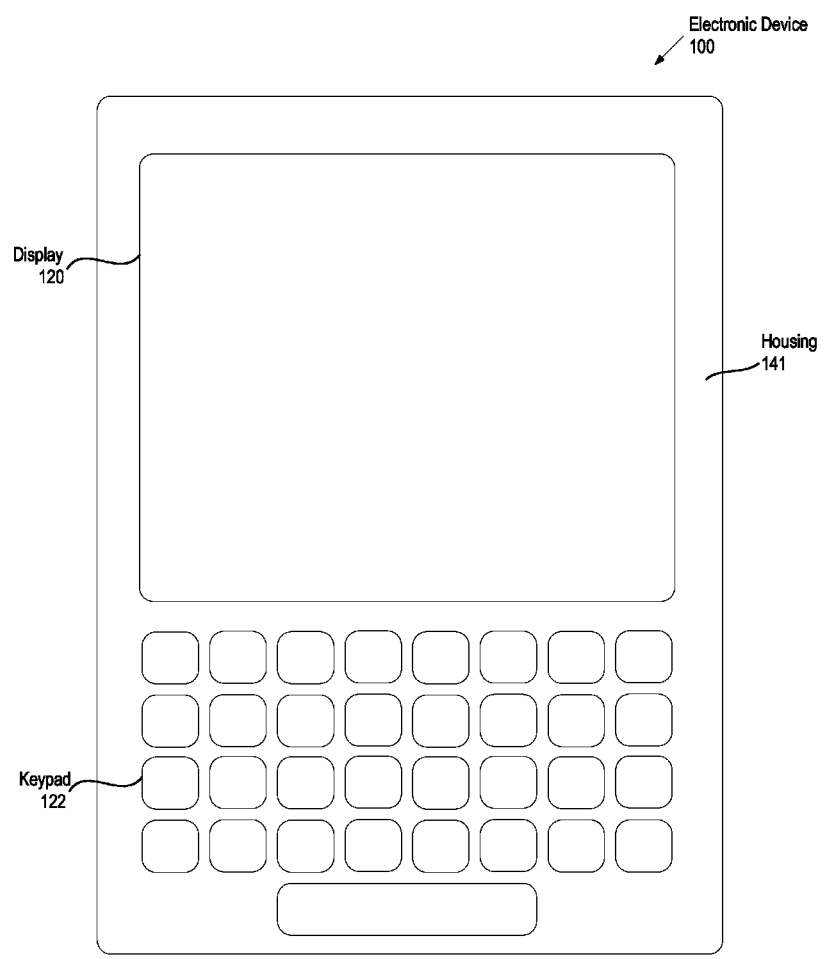
FIG. 3 illustrates a front view of an embodiment of an electronic device.

FIG. 3 illustrates a front view of an embodiment of an electronic device 100. FIG. 3 illustrates a rear view of the electronic device 100. The electronic device 100 may include an electronic book reader, a cellular telephone, a personal digital assistant (PDAs), a portable media player, a tablet computer, a netbook or any portable, compact electronic device.

The electronic device 100 includes the display 120 described above with respect to FIGS. 1 and 2 and further comprises a housing 141 through which the display 120 is visible. The housing 141 houses and protects a number of internal electronic components, such as those described below with respect to FIG. 12, that provide various functionality to the electronic device 100. The housing 141 includes an opening through which the display 120 is visible and also includes an opening through which a keypad 122 can be accessed by a user to provide input to the electronic device 100.

Figure 4:
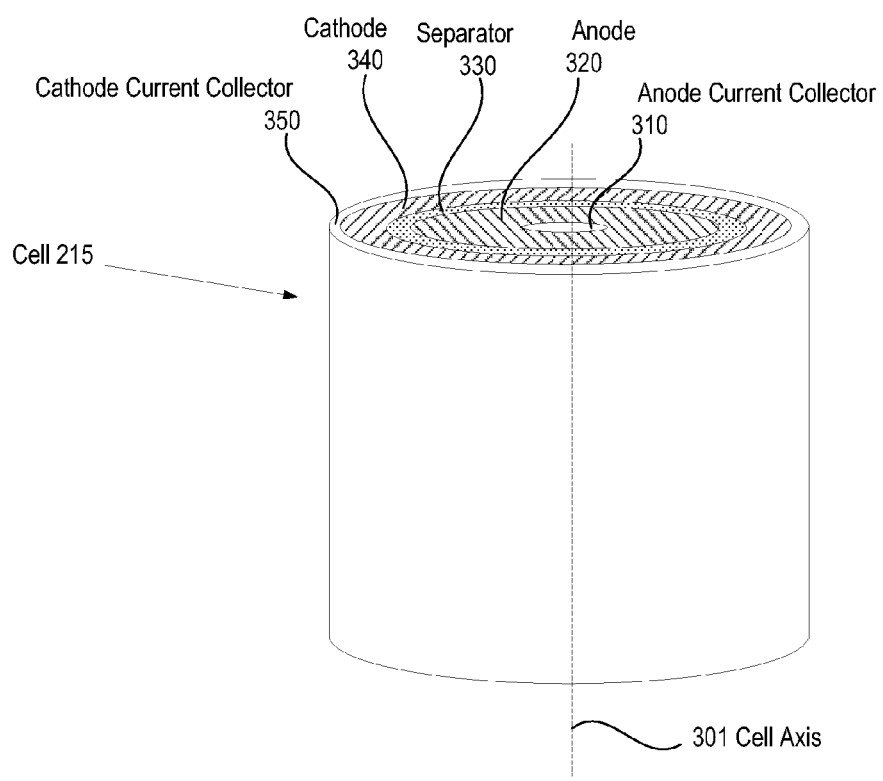
FIG. 4 illustrates a perspective view of an embodiment of a cell.

FIG. 4 illustrates a perspective view of an embodiment of a cell 215. The cell 215 includes a number of components concentrically arranged around a cell axis 301. Although the cell 215 of FIG. 4 is generally cylindrically shaped, the cell 215 may be otherwise shaped. The center of cell includes an anode current collector 310. The anode current collector 310 is surrounded by an anode 320. The anode 320 is surrounded by a cathode 340 and is separated from the cathode 340 by a separator 330. The separator 330 may include an electrolyte to chemically couple the anode 320 and cathode 340. The cathode 340 is surrounded by a cathode current collector 350. In another embodiment, the components are reversed such that the cathode current collector 350 is at the center of the cell 215 and is surrounded by the anode current collector 310.

In one embodiment, the cell 215 is a lithium ion cell. The anode 320 may comprise graphite, hard carbon or silicon. The anode 320 may comprise other materials. The cathode 340 may comprise lithium cobalt oxide ($LiCoO_2$), lithium manganese oxide ($LiMnO_4$), lithium nickel oxide ($LiNiO_2$) or lithium iron phosphate ($LiFePO_4$). The cathode 340 may comprise other materials. As noted above, the separator 330 may include an electrolyte. The electrolyte may be aqueous or a non-aqueous. In one embodiment, the electrolyte comprises lithium salts. The electrolyte may comprise other materials.

The anode current collector 310 and the cathode current collector 350 may be electrically conductive. For example, the anode current collector 310 and cathode current collector 350 may comprise metal. The anode current collector 310 and cathode current collector 350 may comprise other conductive or non-conductive materials.

In a particular embodiment, the cells use a carbon-$LiCoO_2$ electrochemical couple. Further, the cells have a thickness equal to the substrate thickness (T) of 0.7 mm and a cell diameter (D) of 0.5 mm. Spacing the cells over the substrate of a seven-inch display may provide approximately 600 milliamp-hours (mAh) of power. Spacing the cells over the substrate of a ten-inch display may prove approximately 1200 mAh.

Figure 5:
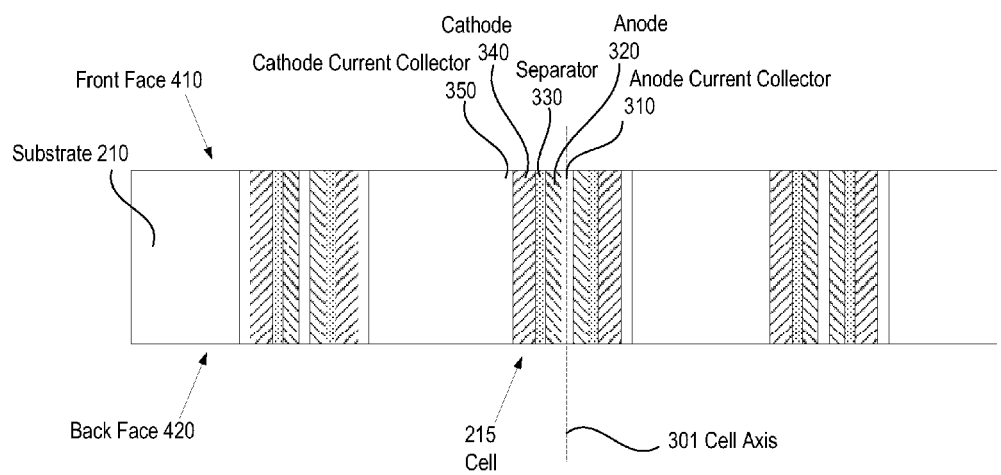
FIG. 5 illustrates a cross-sectional side view of an embodiment of a substrate.

FIG. 5 illustrates a cross-sectional side view of an embodiment of a substrate 210. The substrate 210 includes a plurality of cells 215 embedded therein. Although three cells are illustrated, the cross-section may, in other embodiments, pass through greater than three or fewer than three cells. The components of the cell 215 are embedded in the substrate 210 such that they are exposed at both a front face 410 and a back face 420 of the substrate 210. As described above with respect to FIG. 4, each cell 215 includes a number components concentrically arranged around a cell axis 301, including an anode current collector 310, an anode 320, a separator 330, a cathode 340, and a cathode current collector 350. In one embodiment, the cell axis 301 is substantially perpendicular to the front face 410 and back face 420.

Figure 6:
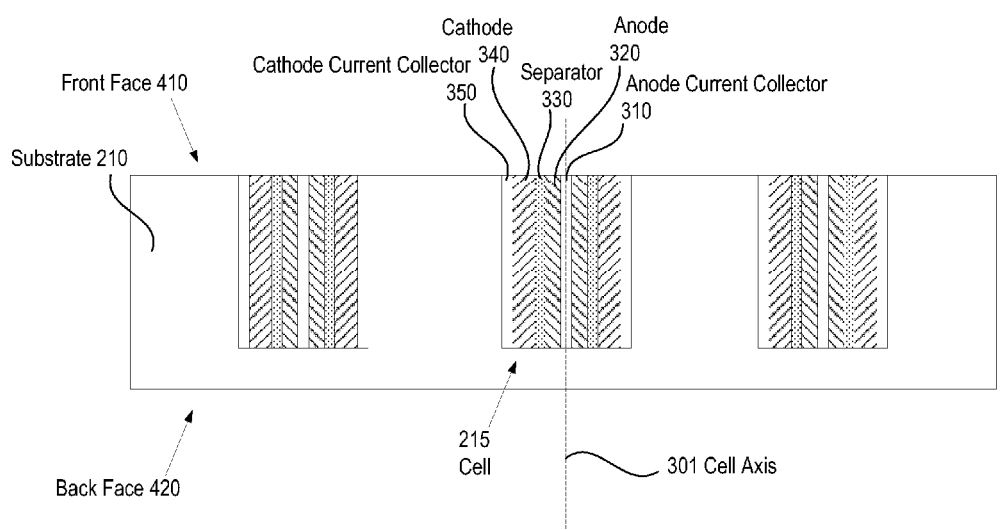
FIG. 6 illustrates a cross-sectional side view of an alternate embodiment of a substrate.

FIG. 6 illustrates a cross-sectional side view of an alternate embodiment of a substrate. In the embodiment of FIG. 6, the components of the cell 215 are embedded in the substrate 210 such that they are exposed at the front face 410 of the substrate 210 only and do not penetrate through the entire substrate to be exposed at a back face 420 of the substrate. In other embodiments, certain components of the cell 215 are exposed at different sides of the substrate 210. For example, in one embodiment, the anode current collector 210 is exposed at the front face 410, but not exposed at the back face 420, whereas the cathode current collector 350 is not exposed at the front face 410, but is exposed at the back face 420. In another embodiment, none of the components of the cell 215 are exposed at either the front face 410 or the back face 420. Rather, electrical connector is made through the substrate 210 without directly exposing the cells 215. Other configurations are possible.

Figure 7:
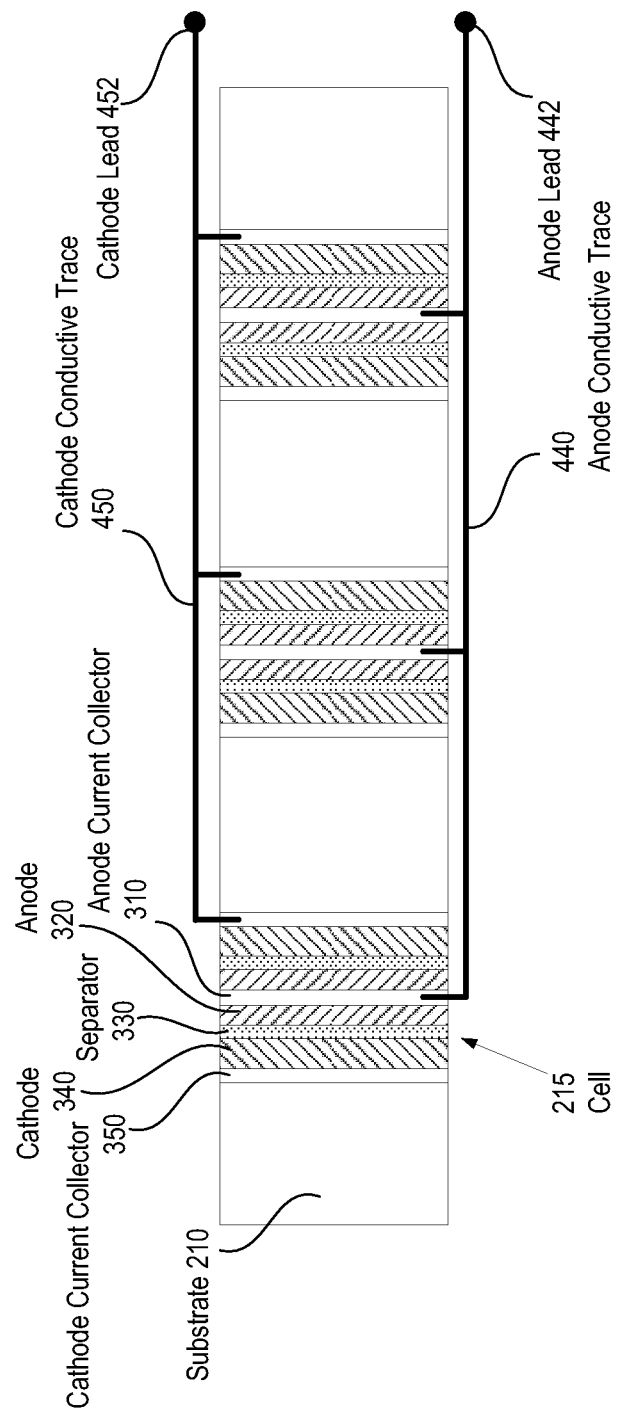
FIG. 7 illustrates a cross-sectional side view of an embodiment of a substrate having cells connected in parallel.

FIG. 7 illustrates a cross-sectional side view of an embodiment of a substrate 215 having cells 215 connected in parallel. The anode current collectors 310 of the cells 215 are electrically coupled by an anode conductive trace 440. Similarly, the cathode current collectors 350 of the cells 215 are electrically coupled by a cathode conductive trace 450. The anode conductive trace 440 is electrically coupled to an anode lead 442 and the cathode conductive trace 450 is electrically coupled to a cathode lead 452. The cells 215 are combined in parallel to provide a voltage across the anode lead 442 and cathode lead 452. Although the anode conductive trace 440 and cathode conductive trace 450 are illustrated on opposite sides of the substrate 215, they may, in another embodiment, be formed on the same side of the substrate 215.

Figure 8:
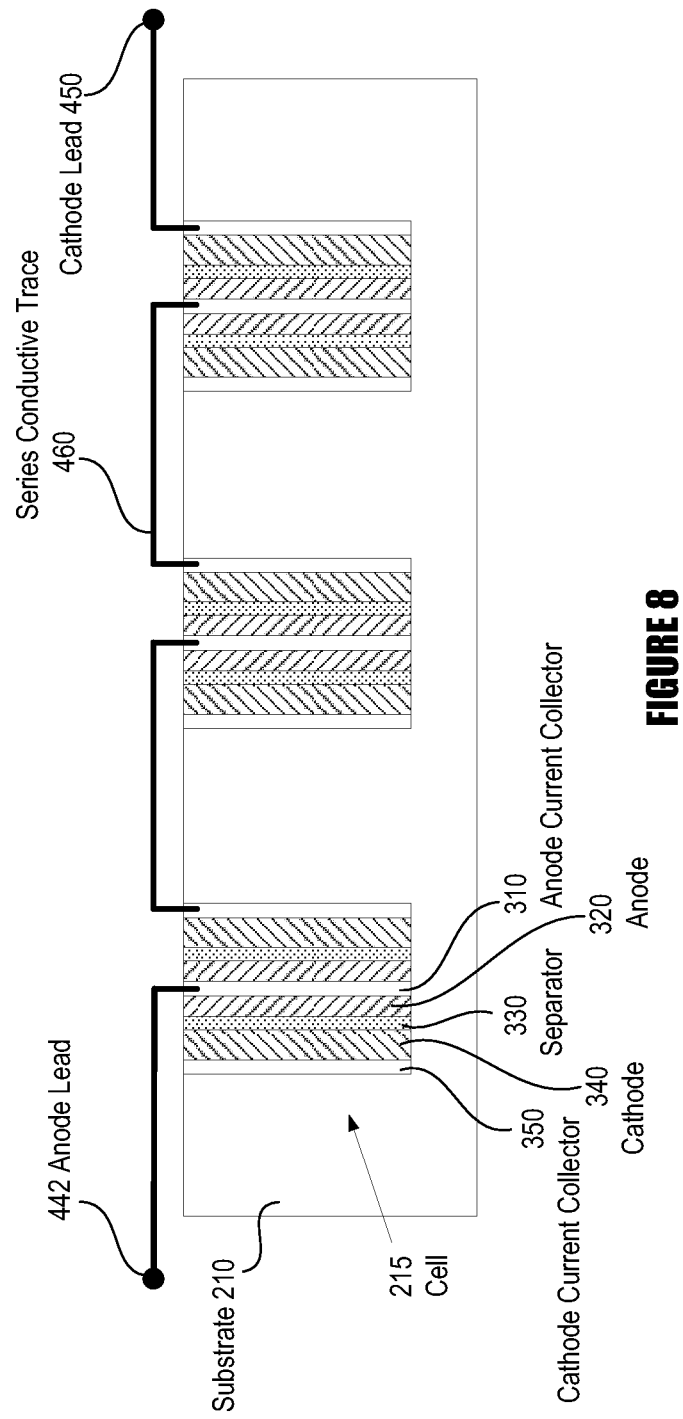
FIG. 8 illustrates a cross-sectional side view of an embodiment of a substrate having cells connected in series.

FIG. 8 illustrates a cross-sectional side view of an embodiment of a substrate 215 having cells 215 connected in series. The anode current collector 310 of each cell 215 is electrically coupled, by a series conductive trace 462, to the cathode current collector 350 of another cell (or to an anode lead 442). Reciprocally, the cathode current collector 350 of each cell 215 is electrically coupled, by the series conductive trace 462, to the anode cathode current collector 310 of another cell (or to a cathode lead 452). The cells 215 are combined in series to provide a voltage across the anode lead 442 and cathode lead 452.

Figure 9:
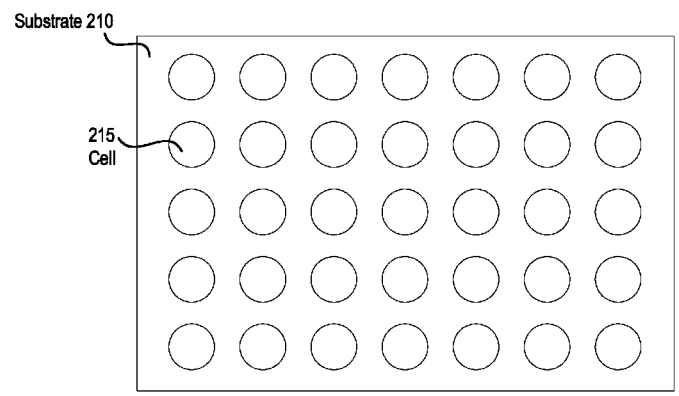
FIG. 9 illustrates a top view of a substrate having cells arranged in a regular grid pattern.
Figure 10:
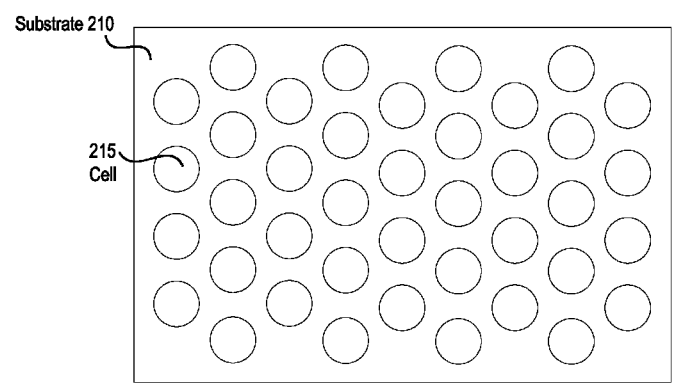
FIG. 10 illustrates a top view of a substrate having cells arranged in an offset grid pattern.

As noted above, the cells 215 may be arranged in any pattern over the substrate 210. FIG. 9 illustrates a top view of a substrate 210 having cells 215 arranged in a regular grid pattern and FIG. 10 illustrates a top view of a substrate 210 having cells 215 arranged in an offset grid pattern. In the regular grid pattern, each cell 215 (except those on the edge) is equidistant from four other cells 215: one above, one below, one to the left, and one to the right. Further, the cell 215 is also equidistant from four other cells along the diagonals, but these cells 215 are further from cell 215 than the other four above, below, left, and right. In the offset grid pattern, each cell 215 (except those on the edge) is equidistant from six other cells 215. The possible cell density in the offset grid pattern may be greater than the possible cell density in the regular grid pattern. The cells 215 may be arranged in concentric circular pattern comprising a series of concentric circles. The cells 215 may be arranged in a random pattern. As noted above, the cells 215 may be arranged in any pattern.

Figure 11:
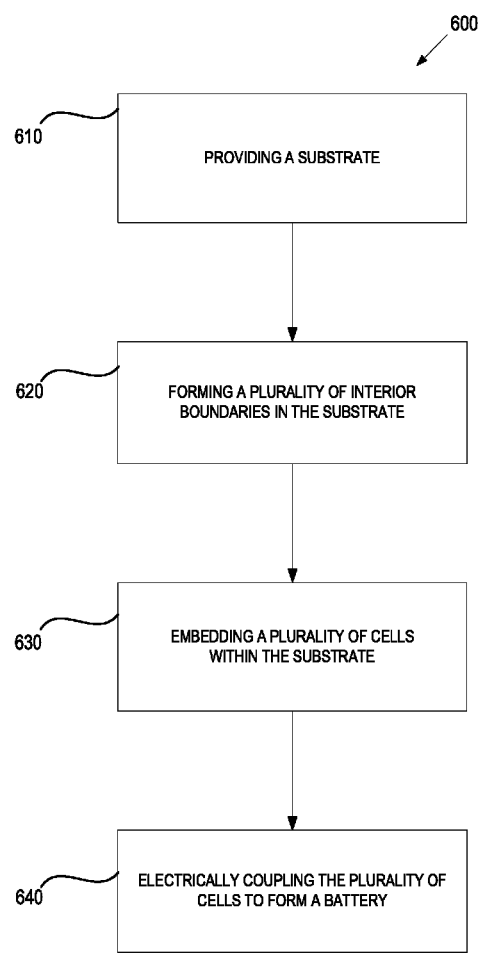
FIG. 11 illustrates a flowchart of a method of forming a battery.

FIG. 11 illustrates a flowchart of a method 600 of forming a battery. The method begins, in block 610, with providing a substrate. In one embodiment, the substrate is composed of glass. In another embodiment, the substrate may be composed of plastic, silicon, metal, or any other material. In one embodiment, the substrate is electrically insulative. In another embodiment, the substrate is electrically conductive.

In block 620, a plurality of interior boundaries are formed in the substrate. The interior boundaries define interior areas, depressions or holes into which electrochemical cells may be disposed (as described below with respect to block 630). The interior boundaries may be formed by chemically etching the substrate. For example, the interior boundaries may be formed by layering a patterned resist layer over the substrate, exposing the substrate to a chemical etchant, and removing the resist layer. The interior boundaries may be mechanically formed by cutting or punching holes through the substrate. The interior boundaries may be formed by deforming portions of the substrate to form depressions which do not pass through the substrate. The interior boundaries may be formed by other processes.

In block 630, a plurality of cells are embedded in the substrate. The plurality of cells may be embedded by disposing a cell in each of the respective interior areas. In one embodiment, the cells are placed whole within the interior areas partially surrounded by the boundaries. Thus, the cells are formed, comprising components such as an anode current collector, an anode, a separator, a cathode, and a cathode current collector, and then disposed within the interior boundaries. In another embodiment, the cells are formed within the interior boundaries. Thus, components such as an anode current collector, an anode, a separator, a cathode, and a cathode current collector are individually placed within the interior boundaries to form a cell. The components of the cell may be, for example, electroplated, screen printed, or vapor deposited into the interior boundaries. The cells may be formed or disposed within the interior boundaries by other processes.

If the substrate is electrically conductive, an insulative layer or passivation layer may be disposed within the interior areas and the cells disposed at least partially surrounded by the layer. The insulative layer prevents the cells from electrically coupling with the substrate. In particular, the insulative layer prevents the cathode current collector from electrically coupling with the substrate. In the substrate is electrically insulative, an insulative layer or passivation layer may not be necessary. Nevertheless, even if the substrate is electrically insulative, the cells may be disposed at least partially surrounded by a layer that is disposed within the interior boundary. For example, the layer may increase adherence between the cathode current collector and the substrate. The layer may have other purposes or may be absent.

In block 640, the cells are electrically coupled to form a battery. The cells may be connected in series, parallel, or some combination of series and parallel. The cells may be connected by one or more conductive traces. The conductive traces may be placed using electroplating, screen printing, vapor deposition, or other processes.

Figure 12:
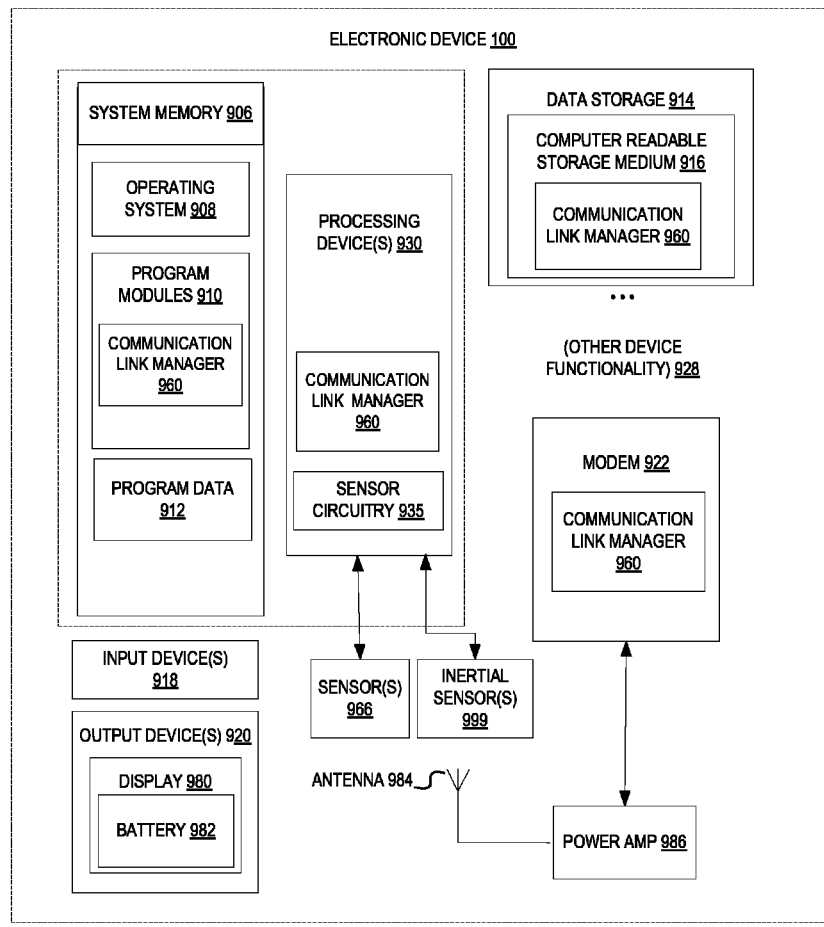
FIG. 12 illustrates a functional block diagram of an embodiment of an electronic device.

FIG. 12 illustrates a functional block diagram of an embodiment of an electronic device. The electronic device 900 may correspond to the electronic device 100 of FIG. 3 and may be any type of computing device such as an electronic book reader, a PDA, a mobile phone, a laptop computer, a portable media player, a tablet computer, a smart phone, a camera, a video camera, a netbook, a desktop computer, a gaming console, a digital video disc (DVD) player, a computing pad, a media center, and the like.

The electronic device 900 includes one or more processing devices 930, such as one or more central processing units (CPUs), microcontrollers, field programmable gate arrays, or other types of processing devices. The electronic device 900 also includes system memory 906, which may correspond to any combination of volatile and/or non-volatile storage devices. The system memory 906 may include one or more of read-only memory (ROM), flash memory, dynamic random access memory (DRAM) such as synchronous DRAM (SDRAM)), and static random access memory (SRAM)). The system memory 906 stores information which provides an operating system component 908, various program modules 910 such as communication link manager 960, program data 912, and/or other components. The electronic device 900 performs functions by using the processing device(s) 930 to execute instructions provided by the system memory 906.

The electronic device 900 also includes a data storage device 914 that may be composed of one or more types of removable storage and/or one or more types of non-removable storage. The data storage device 914 includes a computer-readable storage medium 916 on which is stored one or more sets of instructions embodying any one or more of the methodologies or functions described herein. As shown, instructions for the communication link manager 960 may reside, completely or at least partially, within the computer readable storage medium 916, system memory 906 and/or within the processing device(s) 930 during execution thereof by the electronic device 900, the system memory 906 and the processing device(s) 930 also constituting computer-readable media. The electronic device 900 may also include one or more input devices 918 (keyboard, mouse device, specialized selection keys, etc.) and one or more output devices 920 (displays, printers, audio output devices, etc.). In one embodiment, the input devices 918 and the output devices 920 may be combined into a single device (e.g., a touch screen).

The electronic device 900 further includes a wireless modem 922 to allow the electronic device 900 to wirelessly communicate with other computing devices. The wireless modem 922 allows the electronic device 900 to handle both voice and non-voice communications (such as communications for text messages, multimedia messages, media downloads, web browsing, etc.). The wireless modem 922 may also allow the electronic device 900 to handle other signaling data to facilitate communication of the voice and non-voice data between the electronic device 900 and other devices. The wireless modem 922 may provide network connectivity using any type of mobile network technology including, for example, cellular digital packet data (CDPD), general packet radio service (GPRS), enhanced data rates for global evolution (EDGE), universal mobile telecommunications system (UMTS), 1 times radio transmission technology (1xRTT), evaluation data optimized (EVDO), high-speed down-link packet access (HSDPA), WiFi, HSPA+, WiMAX, Long Term Evolution (LTE) and LTE Advanced (sometimes generally referred to as 4G), etc. In one embodiment, the wireless modem includes the communication link manager 960 in addition to, or instead of, the communication link manager 960 being included in the computer readable storage medium 916, system memory 906 and/or processing device(s) 930. The communication link manager 960 may be implemented as hardware, firmware and/or software of the wireless modem 922. It should be noted that the modem 922 may include a processing component that performs various operations to handle both voice and non-voice communications. This processing component can execute the communication link manager 960. Alternatively, the communication link manager 960 can be executed by a processing component of the electronic device, such as the processing device 930.

The wireless modem 922 may generate signals and send these signals to power amplifier (amp) 980 for amplification, after which they are wirelessly transmitted via antenna 984. The antenna 984 may be directional, omni-directional or non-directional antennas. In addition to sending data, the antenna 984 can be deployed to receive data, which is sent to wireless modem 922 and transferred to processing device(s) 930. In one embodiment, the antenna 984 may be used to form communication links between the electronic device 900 and a base station (e.g., a NodeB or a cell tower).

The processing device(s) 930 and the modem 922 may be a general-purpose processing devices such as a microprocessor, central processing unit, or the like. More particularly, the processing device(s) 930 and the modem 922 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device(s) 930 and the modem 922 may also be one or more special-purpose processing devices such as an application specific integrated circuit (ASIC), a field programmable gate array (FPGA), a digital signal processor (DSP), network processor, or the like.

In one embodiment, electronic device 900 includes one or more sensors 966 such as a physical contact sensor or close proximity sensors. The sensors 966 can detect the human body parts proximate to the electronic device, and convey information regarding the detection to processing device(s) 930. In one embodiment, the sensors 966 may be capacitive sensors that are configured to measure capacitance generated by the human body part proximate to the electronic device using any one of various techniques known in the art, for example, relaxation oscillation, a current verses voltage phase shift comparison, resistor-capacitor charge timing, capacitive bridge division, charge transfer, sigma-delta modulation, or charge-accumulation. In an alternative embodiment, the sensors 966 may also be optical (e.g., infrared) sensors that use an emitter and receiver pair to detect the presence of opaque objects. Alternatively, the sensors 966 may be inductive sensors, which include an inductive loop. When the presence of a human body part (or metal object) is brought close to the inductive sensor, an induction of the inductive loop changes, causing the human body part to be detected. Alternatively, the sensors 966 may be ultrasonic sensors that emit an ultrasonic signal and measure a time duration between when a signal is transmitted and the reflection of that signal received (a.k.a., flight response). The sensors 966 may also include other types of sensors, such as those that operate using the detection principles of resistive (e.g., analog resistive, digital resistive or residual resistive), surface acoustic wave, electromagnetic, near field imaging, or other technologies. In one embodiment, multiple different types of sensors are used. It should also be noted that the sensors 966 may be used to determine a distance between one or more of the antennas and the detected human body part. Though the detected object is described herein as a human body part, other types of objects may also be detected depending on the sensing technologies used.

In one embodiment, electronic device 900 includes one or more inertial sensors 999. The inertial sensors 999 can be used to detect motion of the electronic device 900. In one embodiment, the inertial sensors 999 detect linear accelerations (translational movement) and angular accelerations (rotational movement). The inertial sensors 999 may include accelerometers and/or gyroscopes. Gyroscopes use principals of angular momentum to detect changes in orientation (e.g., changes in pitch, roll and twist). Accelerometers measure accelerations along one or more axes (e.g., translational changes). The gyroscope and accelerometer may be separate sensors, or may be combined into a single sensor. The inertial sensors 999 in one embodiment are micro-electromechanical systems (MEMS) sensors.

In one embodiment, the motion data from the one or more inertial sensors 399 may be used to determine an orientation of the electronic device 300 to determine if a communication link criterion is satisfied (e.g., whether the electronic device 900 is in proximity to a user's body). In another embodiment, the sensor data from the one or more sensors 966 may be used to determine an orientation of the electronic device 900 for to determine if a communication link criterion is satisfied. In a further embodiment, of the motion data and the sensor data may be used to determine whether a communication link criterion is satisfied.

The processing device(s) 930 may include sensor circuitry 935 (e.g., sensor device drivers) that enables the processing device(s) 930 to interpret signals received from the sensor(s) 966 and/or inertial sensors 999. In one embodiment, the sensors 966 and/or inertial sensors 999 output fully processed signals to the processing device(s) 930. For example, the sensors 966 may output a distance, a detected/not detected signal, etc. using a single line interface or a multi-line interface. Similarly, inertial sensors 999 may output an acceleration value (e.g., in Gs). In another embodiment, the sensors 966 output, for example, positional data and/or object presence data (e.g., of a human body part) to the processing devices) 930 without first processing the data. Similarly, inertial sensors 999 may output, for example, voltage values that can be interpreted as acceleration values. In either instance, the processing device(s) 930 may use the sensor circuitry 935 to process and/or interpret the received data. If data is received from multiple sensors 966 and/or inertial sensors 999, processing the data may include averaging the data, identifying a maximum from the data, or otherwise combining the data from the multiple sensors. In one embodiment, in which the sensors 966 include a sensor array, numerous sensors, or a touch panel, processing the data includes determining where on the electronic device the human body part is located from multiple sensor readings.

As mentioned above, the electronic device 900 may include one or more input devices 918 and one or more output devices 920. The output devices 920 may include a display 980 with an embedded battery 982 such as the display 120 of FIGS. 1 and 2.

The foregoing description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of embodiments of the present invention.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

It is to be understood that the above description is intended to be illustrative and not restrictive. Many other embodiments will be apparent to those of skill in the art upon reading and understanding the above description. The scope of the present invention should, therefore, be determined with reference to the appended claims, along with the full scope of equivalents to which such claims are entitled.

What is claimed is:

1. An electronic device comprising:
   an electronic paper display;
   a glass substrate coupled to and mechanically supporting the electronic paper display; and
   a plurality of electrochemical cells embedded in the glass substrate, each of the plurality of electrochemical cells comprising:
   an anode current collector;
   an anode surrounding the anode current collector;
   a cathode surrounding the anode;
   a separator between the anode and the cathode; and
   a cathode current collector surrounding the cathode.

2. The electronic device of claim 1, further comprising one or more conductive traces coupling the plurality of electrochemical cells in series, in parallel, or in a combination thereof to form a battery.

3. The electronic device of claim 1, wherein the plurality of electrochemical cells comprise lithium ion cells.

4. A battery comprising:
   an insulative substrate coupled to and mechanically supporting a display; and
   a plurality of electrochemical cells embedded in the insulative substrate, wherein each of the plurality of electrochemical cells comprises a plurality of components concentrically arranged about a cell axis that is substantially perpendicular to a face of the substrate, and wherein the plurality of electrochemical cells are separated by a distance that is greater than half a cell diameter of the plurality of electrochemical cells.

5. The battery of claim 4, wherein the insulative substrate comprises glass.

6. The battery of claim 4, wherein the insulative substrate is substantially planar.

7. The battery of claim 4, wherein the display comprises an electronic paper display.

8. The battery of claim 4, wherein the plurality of components comprises:
   an anode;
   a separator surrounding the anode; and
   a cathode surrounding the separator.

9. The battery of claim 8, wherein the plurality of components further comprises:
   an anode current collector surrounded by the anode; and
   a cathode current collector surrounding the cathode.

10. The battery of claim 9, further comprising a conductive trace coupling at least a first electrochemical cell of the plurality of electrochemical cells in parallel with a second electrochemical cell of the plurality of electrochemical cells, the conductive trace coupling a first anode current collector of the first electrochemical cell to a second anode current collector of the second electrochemical cell.

11. The battery of claim 9, further comprising a conductive trace coupling at least a first electrochemical cell of the plurality of electrochemical cells in series with a second electrochemical cell of the plurality of electrochemical cells, the conductive trace coupling an anode current collector of the first electrochemical cell to a cathode current collector of the second electrochemical cell.

12. The battery of claim 4, wherein the distance is greater than the cell diameter.

13. The battery of claim 4, wherein the plurality of electrochemical cells are arranged in at least one of a regular grid pattern, an offset grid pattern, a concentric circular pattern or a random pattern.

14. The battery of claim 4, wherein the plurality of electrochemical cells comprises at least one lithium ion cells, alkaline cells, nickel-cadmium cells, nickel metal hydride cells, or capacitors.

15. The battery of claim 4, wherein each of the plurality of electrochemical cells embedded in the insulative substrate is disposed in a respective interior area of the insulative substrate.

* * * * *